United States Patent [19]

Chung et al.

[11] Patent Number: 4,740,721

[45] Date of Patent: Apr. 26, 1988

[54] PROGRAMMABLE LOGIC ARRAY WITH SINGLE CLOCK DYNAMIC LOGIC

[75] Inventors: Randall M. Chung, Laguna Niguel; Bradley S. Masters, Chino, both of Calif.

[73] Assignee: Western Digital Corporation, Irvine, Calif.

[21] Appl. No.: 789,383

[22] Filed: Oct. 21, 1985

[51] Int. Cl.$^4$ .................. H03K 17/16; H03K 19/096; H03K 19/173

[52] U.S. Cl. .................................... 307/468; 307/443; 307/452; 307/469; 307/481; 340/825.83; 364/716

[58] Field of Search ................ 307/443, 452, 468–469, 307/481; 340/825.83; 364/716

[56] References Cited

U.S. PATENT DOCUMENTS 3,974,366  8/1976  Hebenstreit ......................... 307/469

OTHER PUBLICATIONS

"Principles of CMOS VLSI Design—A Systems Perspective" Weste and Eshraghian, Addison-Wesley Publishing 1985.
Weste, et al., "Principles of CMOS VLSI Design–A Systems Perspective", pp. 163–171; 203–221; 368–379; 418–419.
Penney et al., "MOS Integrated Circuits-Theory, Fabrication, Design and Systems Applications of MOS LSI", pp. 260–288.
Myers, et al. "A Design Style for VLSI CMOS", IEEE Journal of Solid–State Circuits, vol. SC-20, No. 3, Jun. 1985, pp. 741–745.
Goncalves, et al., "NORA: A Racefree Dynamic CMOS Technique for Pipelined Logic Structures", IEEE Journal of Solid–State Circuits, pp. 261–266, vol. SC-18, No. 3, Jun. 1983.
May et al., "High Speed Static Programmable Logic Array in LOCMOS", IEEE Journal Solid–State Circuits, vol. SC-11, pp. 365–369, Jun. 1976.

*Primary Examiner*—John Zazworsky
*Assistant Examiner*—M. R. Wambach
*Attorney, Agent, or Firm*—Spensley Horn Jubas & Lubitz

[57] ABSTRACT

Disclosed is a programmable logic array employing dynamic CMOS logic and utilizing a single clock signal and its complement to synchronize said dynamic logic operations. The PLA disclosed employs two logic planes for implementing arbitrary logic equations on input logic signals. The first logic plane and second logic plane are evaluated on separate phases of a clock signal and its complement and are separated by a clocked latch/inverter for providing correct logic evaluation between the logic planes.

3 Claims, 2 Drawing Sheets

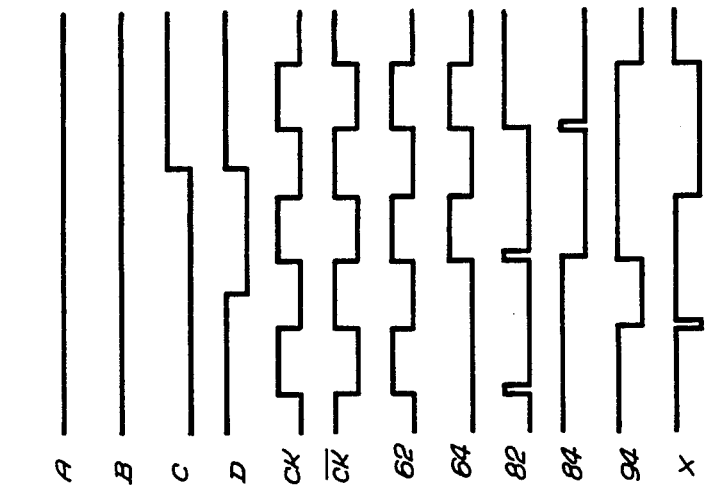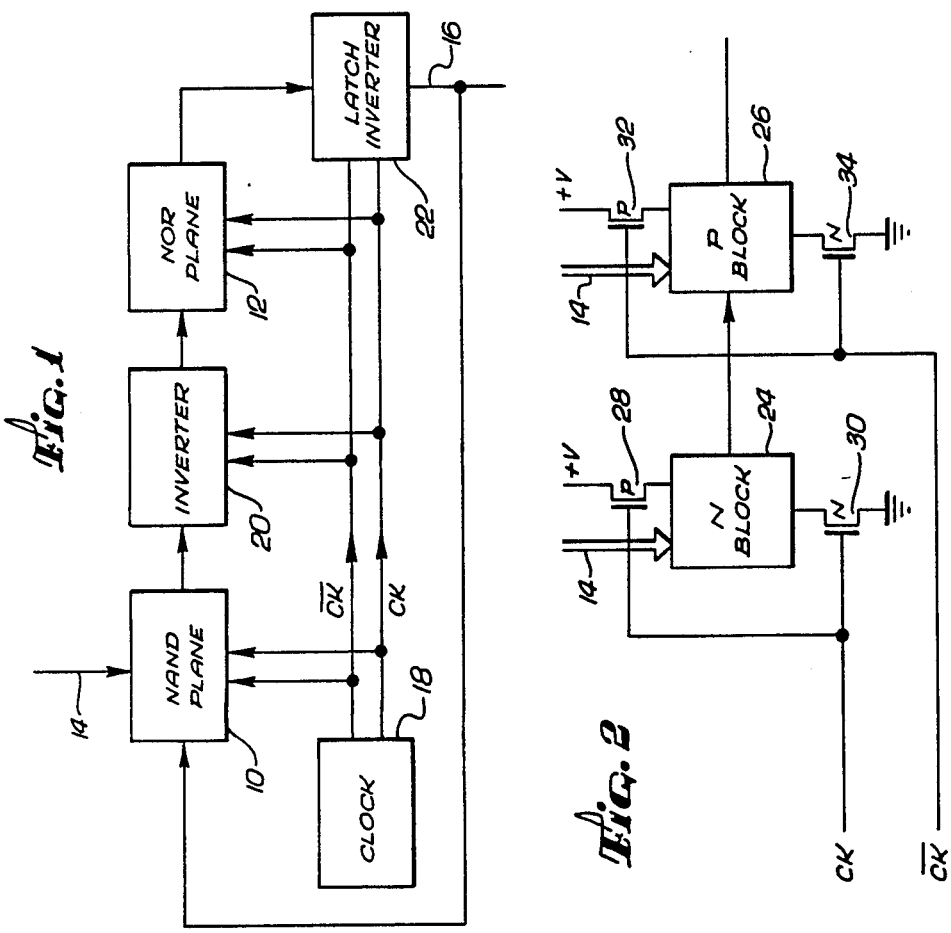

PROGRAMMABLE LOGIC ARRAY WITH SINGLE CLOCK DYNAMIC LOGIC

BACKGROUND OF THE INVENTION

1. Field of the Invention

The present invention relates to solid state circuits employing digital logic. More particularly, the present invention relates to programmable logic arrays employing CMOS field effect transistors.

2. Background of the Invention

Programmable logic arrays (PLAs) are a well-known method of implementing logic in complex digital circuits. Programmable logic arrays typically have a two "plane" structure, i.e. two separate regions or groupings of logic gates with the outputs from one region leading into the other. For example, a typical PLA comprises a plane of AND gates which leads into a plane of OR gates. Equivalently, the AND and OR planes may be implemented using NAND gates and inverters in one plane and NOR gates and inverters in the other plane. This type of two-plane PLA allows a large number of arbitrary logic equations to be implemented in an orderly manner. The orderly structure of PLAs is particularly advantageous in designing large scale integrated (LSI) or very large scale integrated (VLSI) systems.

The programming of a PLA may be achieved in several different ways. For example, in maskprogrammable PLAs the logic array may be built up on an integrated circuit chip using several masks in the formation of the chip. The final logic connections are left to one or two mask steps which can be relatively easily modified. Other more flexible systems, sometimes referred to as field programmable PLAs, use fuses which can be blown or electrically programmable transistors to allow programming after chip manufacture.

In designing complementary metal oxide semiconductor (CMOS) circuits, especially in VLSI applications, the space required for CMOS logic offsets some of the other advantages of CMOS circuitry. This is due to the general requirement in CMOS logic of using equal numbers of n and p channel transistors in designing ratioless CMOS logic gates. In general an N input logic gate implemented in CMOS will have 2 N transistors, N p type and N n type transistors. This results in considerable extra area required in the chip. Ratioed CMOS logic only requires N+1 transistors, typically N n type and one p type, but power is consumed even when the logic circuit is not switching. One technique which has been used to relax this requirement and reduce chip size utilizes a clock to control the operation of the logic gates. Such clocked logic is referred to as dynamic logic. Dynamic logic is described, for example, in William M. Penney, Lillian Lau, eds., MOS Integrated Circuits, Van Nostrand & Co. (1972), pp. 260-288.

In dynamic logic the logic gates are precharged to a predetermined voltage level during one phase of a clock signal and then during a separate "evaluation" clock phase the logic outputs of the gates are determined or evaluated from the logic inputs. The capacitive storage of charge in the transistors allows the retention of information between the precharge and evaluation clock phases. Since there is no continuous current flow in dynamic logic CMOS circuits, power dissipation is at a much lower level than would otherwise be the case in static ratioed CMOS design. Also, the general static CMOS requirement of equal numbers of n and p type transistors may be relaxed reducing the number of transistors per logic gate and reducing chip area.

A drawback of dynamic logic is that correctly synchronizing the precharge and evaluation functions of a dynamic CMOS circuit can raise difficult timing and design problems in complex circuits. Also, other design problems, such as charge sharing, may be present in complex dynamic CMOS circuits.

SUMMARY OF THE INVENTION

The present invention provides a programmable logic array employing CMOS dynamic logic implemented with a single clock signal and its complement. In a preferred embodiment, the present invention employs a two plane logic structure, comprising a NAND gate plane receiving a plurality of inputs, coupled to a NOR gate plane receiving the output from the NAND plane. The NAND plane and NOR plane are separated by a clocked latch/inverter which inverts the output signals from the NAND plane and latches them to allow evaluation at the appropriate clock cycle by the NOR plane. A second latch/inverter may also be provided at the output of the NOR plane to allow the output from the NOR plane to be fed back into the NAND plane to form a finite state machine.

The present invention further provides both n and p channel logic gates in a single plane, and in particular the NAND plane, to allow greater logic flexibility in a single plane. This in turn allows the NAND plane to implement the NOR or inverter logic function on the input signals and thereby obviate separate input lines with complement input signals.

DESCRIPTION OF THE DRAWINGS

FIG. 1 is a block schematic drawing showing the overall layout of the programmable logic array of the present invention.

FIG. 2 is a block schematic drawing showing the n and p type device structure of the logic planes shown in FIG. 1.

FIG. 4 is a timing diagram showing the operation of the circuit of FIG. 3.

DESCRIPTION OF THE PREFERRED EMBODIMENT

Figure 3:
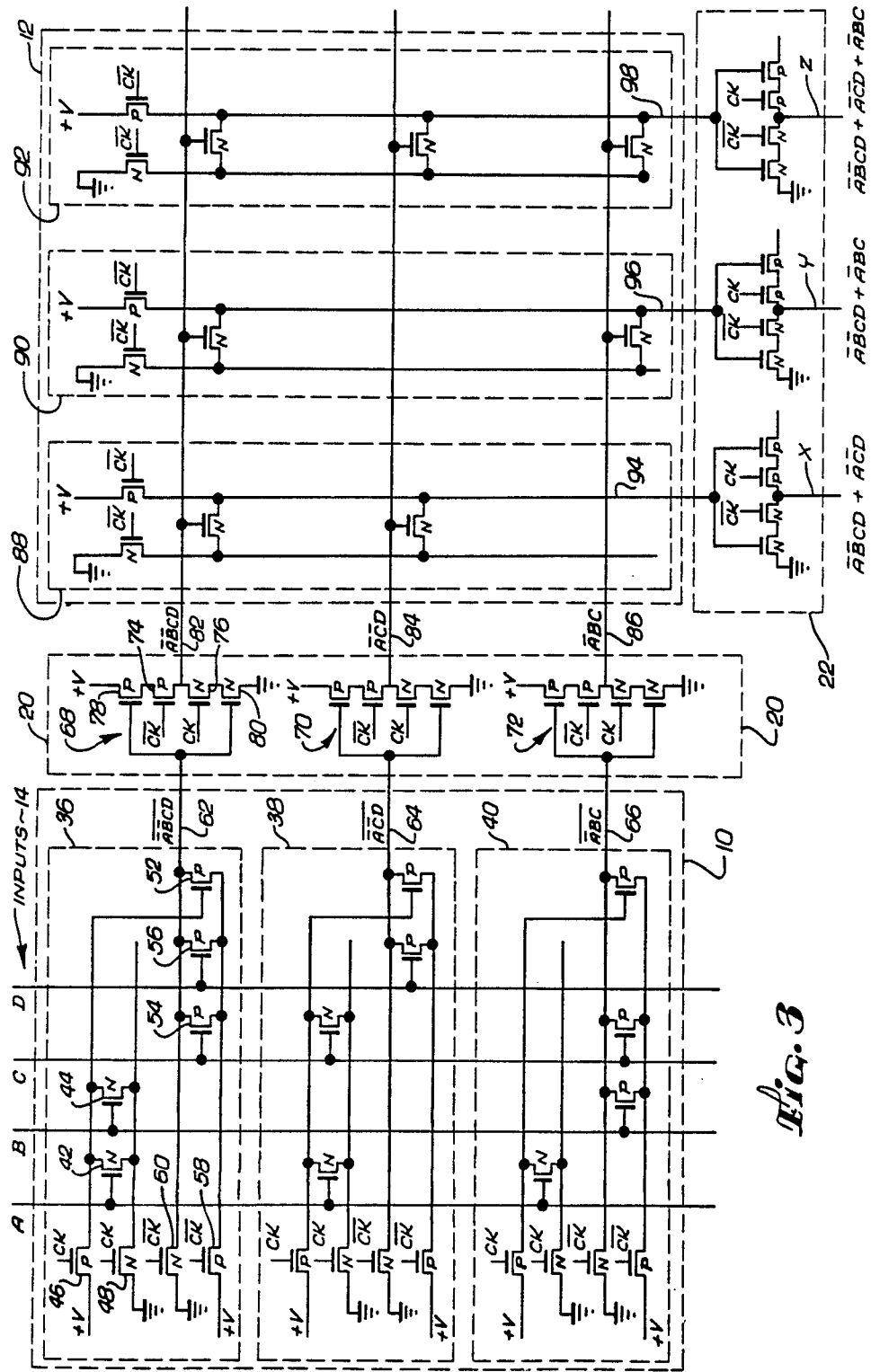
FIG. 3 is a detailed schematic drawing of a particular embodiment of the present invention wherein a specific logic equation is implemented by the PLA.

Referring to FIG. 1, a preferred embodiment of the programmable logic array (PLA) of the present invention is shown in block schematic form. The PLA shown employs two separate planes or arrays of logic gates, namely a NAND plane 10 and a NOR plane 12, for implementing desired logic equations on input logic signals provided at inputs 14. The combination of a NAND plane feeding into a NOR plane allows implementation of arbitrary logic equations under well known rules of Boolean logic. Other logic gates may also be used however, for example an AND plane coupled to an OR plane or a NOR plane coupled to a NAND plane, have equal flexibility for implementing logic equations. Also, as will be discussed further in relation to FIGS. 2 and 3, the logical characterization of NAND plane 10 is somewhat arbitrary due to the fact that it contains NOR gates and inverter gates in addition to performing the NAND logic operation.

NAND plane 10 receives logic signals provided at inputs 14 from circuitry external to the PLA. The PLA performs the desired logic operations on selected ones of the input signals and ultimately provides output logic signals at outputs 16. In the preferred embodiment, inputs 14 are not required to provide a set of complement logic signals in addition to the input signals to have maximum logic flexibility. Such inverted input signals are typically provided in prior art PLAs by inverter gates at the inputs to the PLA. In the present invention, the logic complement or logic inversion operation is provided within the NAND plane 10 thereby cutting in half the number of required input lines. This will be discussed in more detail in relation to FIGS. 2 and 3.

The PLA of FIG. 1 employs a clock 18 which provides a single clock signal CK and its complement clock signal $\overline{CK}$. The clock 18 controls the timing of the operation of the PLA. More specifically, clock 18 synchronizes precharging and evaluation of the logic gates in the NAND and NOR logic planes 10, 12, respectively. The precharging and evaluation of NOR plane 12 are carried out during opposite phases of clock signals CK and $\overline{CK}$ from NAND plane 10.

The clock signals CK and $\overline{CK}$ are also provided to a first latch/inverter 20 and second latch/inverter 22. First latch/inverter 20 receives output signals provided from NAND plane 10 and provides logically inverted signals corresponding thereto. These inverted signals are latched or held by the latch/inverter 20. The latched signals may then be evaluated as inputs to the NOR plane 12 during the precharge clock phase of NAND plane 10. The clocking of the circuitry in the present invention will be described in more detail in relation to FIGS. 2, 3 and 4.

Referring to FIG. 2, a representative logic gate within NAND plane 10 is shown in block schematic form broken down into two groups or blocks of n channel and p channel transistors 24, 26, respectively. Each block of transistors may contain multiple transistors depending on the specific logic being implemented by the logic gate. As may be seen from FIG. 2, the timing of the logic operation of the n channel block 24 is synchronized by the clock signal CK and the timing of the p channel block 26 by $\overline{CK}$. Each of the n channel and p channel blocks 24, 26 employ two clocked transistors. The n channel block 24 employs clocked p transistor 28 and clocked n transistor 30, clocked by CK. The p channel block 26 employs clocked p transistor 32 and clocked n transistor 34, clocked by $\overline{CK}$.

The schematic of FIG. 2 also represents the general structure of the NAND plane 10. For a multigate NAND plane the individual gates would need separate p channel clocked transistors to provide proper logic evaluation.

The n-p logic layout shown in FIG. 2 allows for additional logic flexibility over prior art PLAs wherein only n type or only p type transistors are used for the logic in a single plane. In particular, the combination of blocks of n type transistors with blocks of p type transistors in one logic plane allows combination of the inverter logic operation, and the NOR logic operation, with the NAND logic operation in a single dynamic CMOS logic plane. This reduces space and complexity over PLAs having only p type or n type transistors in a single logic plane. In such PLAs input signals are provided in combination with inverted input signals to allow maximum flexibility in implementing logic equations. This requires an additional set of lines corresponding to the complement signals.

In the PLA of the present invention inverter gates or NOR gates are implemented in the NAND plane 10 where desired in n transistor block 24. The output of the n transistor block 24 is supplied to the p transistor block 26. This 2 block/2 logic function arrangement thus allows the number of lines running through the NAND plane 10 to be cut in half with a concomitant reduction in chip space needed for the PLA. Also, less power will be dissipated by the circuit in general since static inverter gates at the PLA inputs are not employed. The NOR function may also be a faster implementation of the desired NAND logic operation on a plurality of inputs including inverted inputs. Also this NOR/NAND structure may result in a reduced number of transistors and reduced power dissipation for specific PLAs.

The combination of n type transistors followed by p type transistors may be continued in sequence, i.e. n followed by p followed by n, etc., to any desired logical depth in a single logic plane. The limitation on such n—p logic sequences is that the entire logic plane must be precharged and evaluated together during the appropriate clock phases.

The n block/p block arrangement of the NAND logic plane 10 shown in FIG. 2 also ensures that so-called clock race problems are avoided in the circuit. For example, in Neil Weste, Camran Eshraghin, *Principles of CMOS VLSI Design*, Addison Wesley (1985), p. 163-171, 203-221, clock race problems in dynamic CMOS logic are discussed. As discussed therein, if certain design rules are followed, clock race problems may be avoided. The rules followed in FIG. 2 have been referred to as n—p CMOS dynamic logic (Weste, Eshraghin at p. 215). This form of dynamic logic has associated therewith several design problems including charge sharing, added circuit complexity, and added transistors for logic gates. These disadvantages are discussed, e.g. in David J. Myers, Peter A. Ivey, *A Design Style for VLSI CMOS*, IEEE J. Solid-State Circuits, Vol. SC-20, No. 3 (June 1985). In implementing a general logic structure, these considerations may make this form of logic impractical.

More specifically, in a general complex circuit the n—p CMOS dynamic logic design rules may be extremely difficult to implement. Also, it may be difficult or impossible to check these rules in relation to the various logic interrelationships. In the PLA of the present invention, however, the regular layout of the NAND and NOR logic planes allows such design problems to be avoided and the consistency of the implementation of the rules checked. The regular structure of the logic planes also allows charge sharing to be computed for a worst case layout and designed around.

Also, the flexibility resulting from the inverter/NOR logic functions being implemented in the NAND plane in the PLA of the present invention reduces the number of transistors required to implement large numbers of arbitrary logic equations. This feature may in many applications more than offset any additional transistors required to follow the design rules of n—p CMOS dynamic logic The structure of the NAND plane shown in FIG. 2 thus allows a single dynamic plane of logic to combine the inversion, NOR and NAND logic operations. The advantages of such a NOR/NAND combination of logic operations will be more fully appreciated in connection with the detailed circuit schematic of FIG. 3 which shows the implementation of a specific logic equation.

In FIG. 3, a detailed schematic drawing is shown for a specific example of a four input, three output PLA embodying the present invention. The timing of the circuit of FIG. 3 is shown in FIG. 4. The PLA shown in FIG. 3 receives four input logic signals denoted A, B, C, D and provides three outputs X, Y and Z implementing the following three logic equations:

$$X = (\overline{A \cdot B \cdot C \cdot D}) + (\overline{A \cdot C \cdot D})$$

$$Y = (\overline{A \cdot B \cdot C \cdot D}) + (\overline{A \cdot B \cdot C})$$

$$Z = (\overline{A \cdot B \cdot C \cdot D}) + (\overline{A \cdot C \cdot D}) + (\overline{A \cdot B \cdot C})$$

In the specific embodiment shown in FIG. 3, NAND plane 10 comprises three separate logic gates 36, 38 and 40 for performing the NAND logic operation on logic signals $\overline{A}$, $\overline{B}$, C, D, signals $\overline{A}$, $\overline{C}$, D and signals $\overline{A}$, B, C, respectively.

As may be seen from inspection of FIG. 3, the logic gates 36, 38, 40 each contain n transistor blocks and p transistor blocks clocked by CK and $\overline{CK}$ respectively in the manner shown in FIG. 2. For example, in logic gate 36 two n channel transistors 42 and 44 are precharged and evaluated in synchronization with clock signal CK. These precharge and evaluation modes are clocked by clocked p channel transistor 46 and clocked n channel transistor 48 coupled to voltage source +V and ground, respectively. Logic gate 36 further employs p channel transistors 52, 54 and 56. P channel transistors 52, 54 and 56 are clocked in precharge and evaluate modes by clock signal $\overline{CK}$ applied to clocked p channel transistor 58 and clocked n channel transistor 60, coupled to voltage supply +V and ground respectively.

The two n channel transistors 42, 44 receive input signals A and B respectively on their gates and provide their output on line 50 to p channel transistor 52. P channel transistors 54 and 56 receive input signals C and D. The output of the p channel transistors 52, 54, 56 is provided on line 62.

When the clock signal CK is low, both the n channel transistors 42, 44 and the p channel transistors 52, 54 and 56 are precharged. The n channel transistors 42, 44 have their output line 50 precharged to a high logic level by p channel transistor 46 providing a conductive path to +V by CK applied to its gate being low. P channel transistors 52, 54 and 56 have their output line 62 precharged to a low logic level by clocked n channel transistor 60 being placed in a conductive state by clock signal $\overline{CK}$ being high thereby pulling line 62 down to ground.

When clock signal CK goes high and clock signal $\overline{CK}$ goes low, n channel transistors 42, 44 and p channel transistors 52, 54 and 56 are evaluated, i.e. their outputs are determined from the input signals applied to their gates. The capacitance of the transistors maintains the charge placed on the output lines during the precharge clock phase for a sufficient period of time to allow the evaluation of the transistors. It may be seen by preparing a logic table for the inputs A, B, C, D and the output provided on line 62 that the output on line 62 represents the logical NAND operation on $\overline{A}$, $\overline{B}$, C, D as inputs, i.e. the output on line 62 during the evaluation phase will be $\overline{\overline{A} \cdot \overline{B} \cdot C \cdot D}$. Also, it may be seen that n channel transistors 42, 44 operate as a NOR gate on inputs A and B.

Similarly, during the evaluation phase of the clock signal, i.e. CK high, logic gate 38 provides a logic signal on line 64 corresponding to $\overline{\overline{A} \cdot \overline{C} \cdot D}$ and logic gate 40 provides a signal on line 66 corresponding to $\overline{\overline{A} \cdot B \cdot C}$. The timing relationship of the output on lines 62 and 64 with CK and $\overline{CK}$ and inputs A, B, C and D is shown in FIG. 4.

During the evaluation phase of NAND plane 10, the outputs from logic gates 36, 38 and 40 are provided to clocked latch/inverters 68, 70 and 72, respectively. Each of the latch/inverters 68, 70 and 72 have the same structure. For example, latch/inverter 68 includes a clocked p channel transistor 74 and a clocked n channel transistor 76 clocked by $\overline{CK}$ and CK respectively. Latch/inverter 68 further includes a p channel transistor 78 coupled to the voltage supply +V and an n channel transistor 80 coupled to ground. Both transistors 78 and 80 receive the output of logic gate 36 provided along line 62 to the gates thereof.

When the NAND gate is in the evaluate mode, i.e. CK high and $\overline{CK}$ low, the two clocked transistors 74 and 76 of latch/inverter 68 will be in a conductive state and latch/inverter 68 will operate as an inverter gate. Therefore, latch/inverter 68 will provide a logic signal on line 82 corresponding to $\overline{A} \cdot \overline{B} \cdot C \cdot D$, i.e. the inverted or complement signal of that supplied along line 62. Similarly, during the NAND plane evaluate clock phase, latch/inverter 70 provides a signal $\overline{A} \cdot \overline{C} \cdot D$ along line 84 and latch/inverter 72 provides signal $\overline{A} \cdot B \cdot C$ along line 86. When the clock signal CK goes low and $\overline{CK}$ goes high, p channel transistor 74 and n channel transistor 76 go nonconductive and latch the logic value on line 82 at its value during the evaluate phase. This latched logic value on line 82 is held by the capacitance of the transistors in latch 68 in the same manner as discussed above in relation to the precharging of the NAND plane 10. Similarly, latch/inverters 70, 72 latch the logic values on lines 84 and 86 respectively during the clock cycle CK low, $\overline{CK}$ high.

Still referring to the specific embodiment of FIG. 3, the specific implementation of the NOR plane 12 employs three dynamic NOR gates 88, 90 and 92. NOR gates 88, 90 and 92 are clocked in a similar manner to the logic gates in NAND plane 10 except that the NOR gates 88, 90 and 92 are precharged when $\overline{CK}$ is low and CK is high and evaluated when $\overline{CK}$ is high and CK is low. In other words, NOR gates 88, 90 and 92 are evaluated and precharged during the opposite clock phases from the logic gates in NAND plane 10. Therefore, when the inverted outputs of the NAND plane 10 are latched in latch/inverters 68, 70 and 72, NOR gates 88, 90 and 92 will evaluate these logic values, i.e. perform the NOR logic operation on the selected lines. Specifically, NOR gate 88 will perform the NOR operation on logic values latched on lines 82 and 84, NOR gate 90 will NOR the logic values on lines 82 and 86, and NOR gate 92 will NOR the logic values on lines 82, 84 and 86. The results of these NOR logic operations will be provided during the NOR plane evaluation phase on lines 94, 96 and 98 respectively.

The latching of the signals on lines 82, 84 and 86 allows these latched logic values to be evaluated by NOR plane 12 without any spurious logic values. For example, referring to FIG. 4 it can be seen that spurious logic values appear on line 82 during transition from precharge to evaluate clock phases of the NAND plane.

The NOR plane does not evaluate at these phases of the clock signal, however, and evaluation of these spurious logic values is avoided.

The NOR plane 12 output logic values provided along lines 94, 96 and 98 are in turn inverted and latched by a second group of latch/inverters 22. These latch/inverters, 100, 102, 104 respectively, operate in the same manner as latch/inverters 68, 70 and 72, however they are latched during clock signal CK low and $\overline{CK}$ high, i.e. during the evaluate phase of NOR plane 12. This second group of latch/inverters 22 thus provides latched logic signals on lines X, Y and Z. The latching function of latch/inverter 22 enables the outputs provided on lines X, Y and Z to be fed back as inputs to NAND plane 10 to be evaluated during the evaluate phase of NAND plane 10. This enables the PLA to operate as a finite state machine if desired.

The output logic signals on lines X, Y and Z correspond to the following logic relationship with A, B, C and D:

$$X = (\overline{A} \cdot \overline{B} \cdot C \cdot D) + (\overline{A} \cdot \overline{C} \cdot D)$$

$$Y = (\overline{A} \cdot \overline{B} \cdot C \cdot D) + (\overline{A} \cdot B \cdot D)$$

$$Z = (\overline{A} \cdot \overline{B} \cdot C \cdot D) + (\overline{A} \cdot \overline{C} \cdot D) + (\overline{A} \cdot \overline{B} \vee C)$$

Thus, the outputs latched on lines, X, Y and Z correspond to the logic equations desired to be implemented on the inputs A, B, C and D.

Therefore, it may be seen that the PLA of the present invention enables logic equations to be implemented using relatively few transistors with correspondingly reduced chip space in a LSI or VLSI application. Furthermore, the clocked nature of the PLA ensures low power dissipation as compared with a dynamic NMOS PLA or static CMOS PLA of the same complexity.

While the present invention has been described in terms of preferred embodiments employing a NAND logic plane and a NOR logic plane, it may be seen that the present invention is equally applicable to other combinations of logic planes. Also, while the preferred embodiments have been shown with the NAND plane and NOR plane clocked on specific phases of a single clock and clock complement signal, the present invention may employ two clock signals which are not exact complements of each other as long as they correctly synchronize the precharge and evaluation of the two logic planes. Furthermore, it will be appreciated that the specific circuit configurations and specific choice of p and n channel transistors shown in the preferred embodiments described are capable of considerable rearrangement and modification without departing from the scope of the present invention.

It will be apparent to one skilled in the art that other changes in the details of the preferred embodiments described above may be made and such alternate embodiments are within the scope of the present invention. Thus, the present invention is not intended to be limited to the above described preferred embodiment and is instead best described by the following claims.

What is claimed is:

1. A programmable logic array implemented in a complementary metal oxide semiconductor integrated circuit having a voltage supply and a circuit ground, comprising:
    a plurality of inputs for receiving a plurality of input logic signals;
    clock means for providing a single clock signal and a single complement clock signal;
    first logic plane means for receiving said input logic signals and performing predetermined logic operations thereon and outputting a plurality of first output logic signals, said first logic plane means comprising:
        a first plurality of clocked p type transistor means coupled to the voltage supply, selected ones receiving said clock signal and selected ones receiving said complement clock signal, for selectively providing a conductive path to said voltage supply;
        one or more clocked n type transistor means coupled to circuit ground, selected ones receiving said clock signal and selected ones receiving said complement clock signal, for selectively providing a conductive path to circuit ground;
        a plurality of n type transistor means for receiving selected ones of said input signals and outputting n stage output logic signals; and
        a plurality of p type transistor means for receiving selected ones of said input signals and selected ones of said n stage output logic signals and outputting said first output logic signals; first latch means, responsive to said first
    output logic signals and said clock signal and said complement clock signal, for performing the logical inversion operation on said first output logic signals and outputting a plurality of latched output signals corresponding thereto; and
    second logic plane means for receiving said plurality of latched output signals, performing a second predetermined logic operation thereon and providing output logic signals, comprising:
        a second plurality of clocked p type transistor means coupled to the voltage supply for receiving said complement clock signal and selectively providing a conductive path to said voltage supply in response to said complement clock signal;
        one or more clocked n type transistor means coupled to circuit ground for receiving said complement clock signal and selectively providing a conductive path to circuit ground in response to said complement clock signal; and
        A plurality of n type transistor means coupled to said clocked p type transistor means and said clocked n type transistor means for receiving said latched output signals and providing said output logic signals.

2. A CMOS programmable logic array comprising:
    a plurality of inputs for receiving a plurality of input logic signals;
    a source of clock signals and complement clock signals;
    a first logic plane of first logic means for performing predetermined logic operations, comprising:
        a block of n type transistors responsive to said clock signals, and having one or more of said n type transistors coupled to selected inputs;
        a block of p type transistors responsive to said complement clock signals and said n channel block and including one or more p type transistors coupled to selected inputs;
    wherein said first logic plane provides one or more first output signals corresponding to said predetermined logic operations performed on selected input logic signals;

clocked latch means for receiving said first output signals and latching said first output signals during a predetermined phase of said clock signal;

a second logic plane of second logic means for performing predetermined logic operations on said latched output signals and providing second output signals, each of said second logic means having a block of n channel transistors responsive to said complement clock signals and receiving selected latched output signals.

3. A CMOS programmable array as set out in claim 2, further comprising second clocked latch means for receiving said second output signals and latching said second output signals during a predetermined phase of said complement clock signal.

* * * * *